United States Patent
Tsurumi

(10) Patent No.: US 6,714,262 B1
(45) Date of Patent: Mar. 30, 2004

(54) CHANNEL SELECTION DEVICE FOR RECEIVING DIGITAL TV BROADCASTING, RECEIVING DEVICE AND CHANNEL SELECTION METHOD

(75) Inventor: Atsushi Tsurumi, Kawasaki (JP)

(73) Assignee: Kabushiki Kaisha Kenwood, Tokyo (JP)

(*) Notice: Subject to any disclaimer, the term of this patent is extended or adjusted under 35 U.S.C. 154(b) by 0 days.

(21) Appl. No.: 09/913,518

(22) PCT Filed: Feb. 10, 2000

(86) PCT No.: PCT/JP00/00759

§ 371 (c)(1),
(2), (4) Date: Aug. 15, 2001

(87) PCT Pub. No.: WO00/49799

PCT Pub. Date: Aug. 24, 2000

(30) Foreign Application Priority Data

Feb. 17, 1999 (JP) .......................................... 11-038425

(51) Int. Cl.⁷ .............................. H04N 5/50; H04N 5/44
(52) U.S. Cl. ........................ 348/731; 348/726; 348/735
(58) Field of Search .................................. 348/725, 726, 348/731, 732, 733, 735, 536; 455/150.1, 179.1, 180.3, 182.1, 182.3, 183.1, 183.2, 188.1, 190.1, 192.3; 375/316, 324, 327, 340, 344, 345; H04N 5/44, 5/455, 5/50

(56) References Cited

U.S. PATENT DOCUMENTS 4,819,069 A * 4/1989 Tanaka ....................... 348/731
5,621,767 A * 4/1997 Brandt et al. ................ 348/735
6,118,499 A * 9/2000 Fang ........................... 348/726

FOREIGN PATENT DOCUMENTS

| GB | 2 319 129 | 5/1998 |
|----|-----------|--------|
| JP | 06-006693 | 1/1994 |
| JP | 06-314958 | 11/1994 |
| JP | 09-322084 | 12/1997 |

OTHER PUBLICATIONS

International Search Report dated May 23, 2000.

* cited by examiner

*Primary Examiner*—Sherrie Hsia
(74) *Attorney, Agent, or Firm*—Eric J. Robinson; Robinson Intellectual Property Law Office, P.C.

(57) ABSTRACT

A tuner unit generates a local oscillation signal which is multiplied by a received first IF signal to change the frequency of the received first IF signal, and converts the frequency-changed first IF signal into a baseband signal. A demodulation unit detects the signal level of demodulated data, and notifies the signal level to a control unit. The control unit compares the signal level notified by the demodulation unit with a reference value stored in a storage unit, and if the signal level is equal to or smaller than the reference value, makes the tuner unit change the frequency of a local oscillation signal to be used for frequency conversion of the first IF signal and perform a channel selection in a next frequency range. Time taken to start providing a service can therefore be shortened.

10 Claims, 6 Drawing Sheets

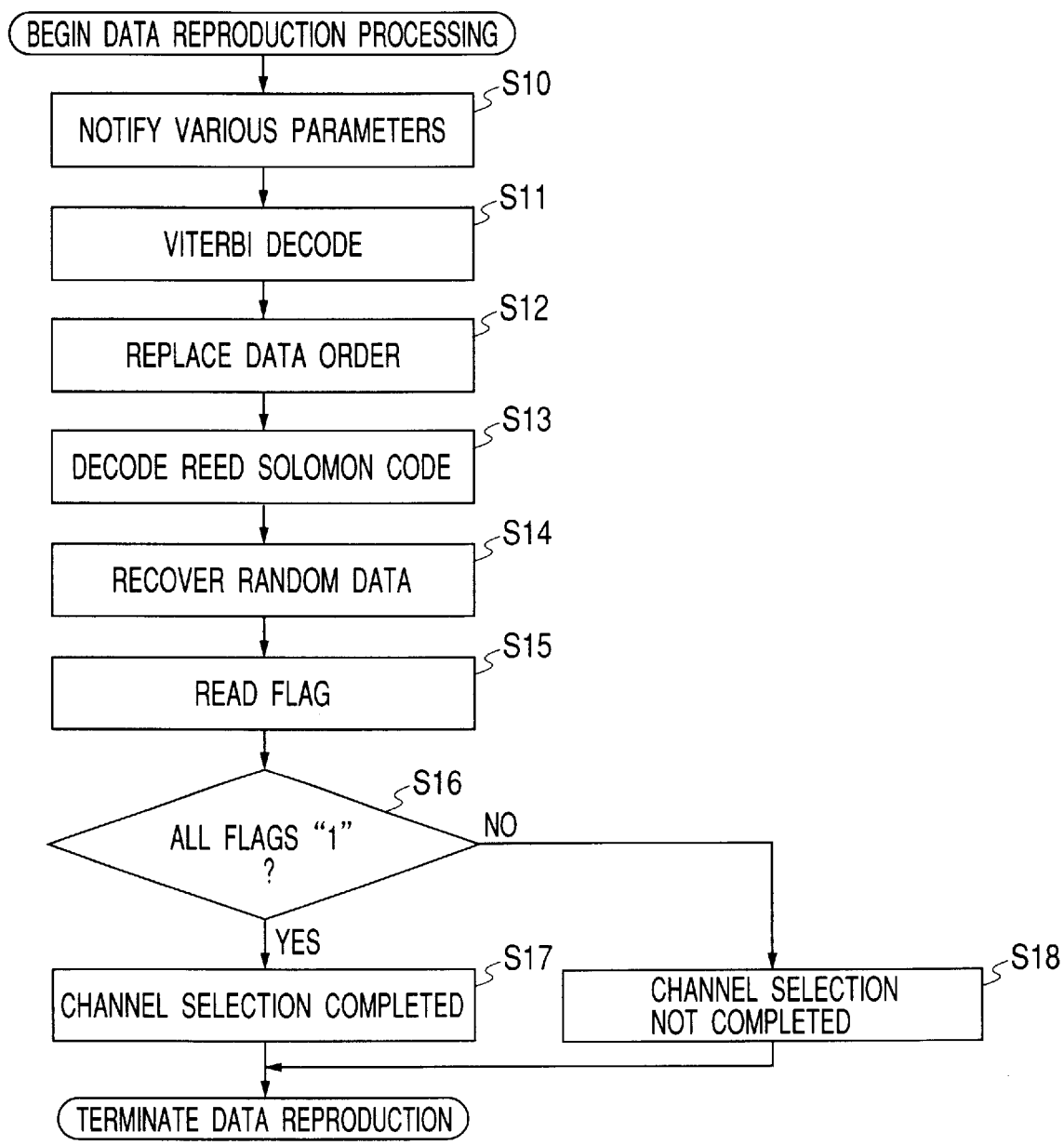

CHANNEL SELECTION DEVICE FOR RECEIVING DIGITAL TV BROADCASTING, RECEIVING DEVICE AND CHANNEL SELECTION METHOD

FIELD OF THE INVENTION

The present invention relates to a channel selection apparatus, a receiver and a channel selection method, respectively for receiving and reproducing digital TV broadcast data by sweeping a predetermined frequency range. More particularly, the invention relates to a channel selection apparatus, a receiver and a channel selection method, respectively for receiving digital TV broadcast data, capable of starting providing services by presetting all receivable (tunable) stations in a short time.

RELATED ART

A channel selection apparatus is known which sweeps a predetermined frequency range in a broadcast band and tunes in a desired channel to receive digital TV broadcast. A channel selection apparatus of this type establishes synchronization by sweeping a predetermined frequency range and derives a MPEG2 (Moving Picture Expert Group Phase 2) transport stream signal from an IF (Intermediate Frequency) signal in order to provide services.

Such a channel selection apparatus for receiving digital TV broadcast presets receivable channels in the following manner. The frequency of a local oscillation signal is sequentially changed in the unit of a predetermined frequency range capable of AFC (Automatic Frequency Control). Each time the oscillation frequency is changed, a received signal is demodulated to monitor a signal reception state of various circuits constituting a demodulation circuit. Namely, the channel selection apparatus monitors a carrier lock state by a carrier reproduction circuit, a clock signal lock state by a clock reproduction circuit, an error rate in a Viterbi decoder and a Reed Solomon decoder, and a detection state of a synchronization pattern (synchronization byte) of an MPEG2 transport stream signal by a de-scrambler. The channel selection apparatus monitors a lock state, error rate and the like of such signals to judge whether data is being reproduced correctly. If it is decided that the data is not reproduced correctly, a channel selection is performed in the next predetermined frequency range. If it is decided that the data is being produced correctly, the channel selection apparatus stores the tuned frequency to preset it and make it easy to tune in the channel at the next channel selection.

With the above-described conventional techniques, each time the frequency of a local oscillation signal is changed, received data is demodulated and the state of various signals in the demodulation circuit is monitored to judge whether data is being reproduced correctly. This method is therefore associated with the problem that a time taken to perform a channel selection is longer than that for an analog channel selection. Since a defined band, particularly of a satellite broadcast band, is broad (950 MHz to 2150 MHz), it takes a very long time to sweep the whole band in which digital broadcast services are transmitted, to select channels and to preset frequency data and the like.

The present invention has been made under the above-described circumstance and provides a channel selection apparatus, a receiver and a channel selection method, respectively for receiving digital TV broadcast data, capable of starting providing services by presetting all receivable channels in a short time.

DISCLOSURE OF THE INVENTION

In order to achieve the above object of the invention, a channel selection apparatus, according to a first aspect of the invention, for digital TV broadcast use for receiving a first intermediate frequency (IF) signal and for automatically sweeping a predetermined frequency range for tuning, said apparatus comprises:

oscillation signal creation means for creating a local oscillation signal to be used for changing the frequency of the intermediate frequency signal, the oscillation signal creation means being made of a PLL synthesizer and the like;

frequency conversion means for converting the frequency of the intermediate frequency signal by using the local oscillation signal created by the oscillation signal creation means, the frequency conversion means being made of a mixer and the like;

data demodulation means for demodulating data in the intermediate frequency signal whose frequency was converted by the frequency conversion means, the data modulation means being made of a quadrature detection unit, an A/D converter, an interpolation unit, a roll-off filter and the like; data reproduction means for reproducing service data for providing a service from the data demodulated by the data demodulation means, the data reproduction means being made of a Viterbi decoder, a convolution de-interleaver, a Reed Solomon decoder, a de-scrambler and the like;

signal level detection means for detecting a signal level of the data demodulated by the data demodulation means; and operation switching means for deciding whether the signal level detected by said signal level detection means is larger than a reference value, said operation switching means being operable to change the frequency of the local oscillation signal by an amount corresponding to said predetermined frequency range without subsequently operating said reproduction means so as operation in a new frequency range, if it is decided that the signal level detected by said signal level means is equal to or smaller than the reference level, and data reproduction means for reproducing service data for providing a service from the data demodulated by said data demodulation means.

According to the invention, the oscillation signal creation means generates a local oscillation signal to be used for changing the frequency of the received intermediate frequency signal, and the data demodulation means demodulates data in the intermediate frequency signal whose frequency was converted by the frequency conversion means. The data reproduction means reproduces service data for providing a service from the data demodulated by the data demodulation means. The signal level detection means detects a signal level of the data demodulated by the data demodulation means, and the operation switching means decides whether the signal level detected by the signal level detection means is larger than a reference value. The signal level detection means changes the frequency of the local oscillation signal if it is decided that the signal level detected by the signal level detection means is equal to or smaller than the reference level, and performs a channel selection in a new frequency range. Accordingly, if the signal level of the data demodulated by the data demodulation means is equal to or smaller than the reference value, the next frequency range is immediately swept for a channel selection without reproducing the data for providing a service. It is therefore possible to perform a channel selection in a short time.

If it is decided that the signal level detected by the signal level detection means is larger than the reference value, the operation switching makes the data reproduction means reproduce service data for the first time.

It is preferable that:

the data reproduction means comprises signal amplifier means for amplifying the intermediate frequency signal whose frequency was converted by the frequency conversion means, the signal amplifier means being made of an AGC amplifier and the like; and the signal level detection means comprises means for feeding back a voltage to the signal amplifier means, the voltage defining a gain of the signal amplifier means to make constant a power of an input signal to the data modulation means.

Accordingly, the signal level detection means can detect the signal level only when data is demodulated. By detecting the signal level quickly and switching between operations, time taken to select a channel can be shortened.

A channel selection method, according to a second aspect of the invention, for digital TV broadcast use, for receiving a first intermediate frequency (IF) signal and automatically sweeping a predetermined frequency range for tuning said method comprises:

an oscillation signal creation step of creating a local oscillation signal to be used for changing the frequency of the intermediate frequency signal;

a frequency conversion step of changing the frequency of the intermediate frequency signal by using the local oscillation signal created by the oscillation signal creation step;

a data demodulation step of demodulating data in the intermediate frequency whose frequency was changed by the frequency conversion step;

a signal level detection step of detecting a signal level of the data demodulated by the data demodulation step;

a signal level deciding step of deciding whether the signal level detected by the signal level detection step is larger than a reference value;

operation switching step of changing the frequency of the local oscillation signal by an amount corresponding to said predetermined frequency range to return said frequency conversion step, if it is decided that the signal level detected in said signal level is equal to or smaller than the reference level, and;

a data reproduction step of reproducing service data for providing a service from the data demodulated by the data demodulation step if the signal level deciding step decides that the signal level is larger than the reference level.

According to the invention, the oscillation signal creation step generates a local oscillation signal to be used for changing the frequency of a received intermediate frequency signal. The frequency conversion step changes the frequency of the intermediate frequency signal by using the local oscillation signal created by the oscillation signal creation step. The date demodulation step demodulates data in the intermediate frequency whose frequency was changed by the frequency conversion step. The signal level detection step detects a signal level of the data demodulated by the data demodulation step. The signal level deciding step decides whether the signal level detected by the signal level detection step is larger than a reference value. The operation switching means operate to change the frequency of the level oscillation without moving to the subsequent reproduction step, so as to sweep a new frequency range if it is decided that the signal level detected in said signal level is equal to or smaller than the reference level. The data reproduction step reproduces service data for providing a service from the data demodulated by the data demodulation step if the signal level deciding step decides that the signal level is larger than the reference level. Accordingly, if the signal level of the data demodulated by the data demodulation step is equal to or smaller than the reference value, the next frequency range is immediately swept for a channel selection without reproducing service data. Therefore, it becomes possible to remarkably shorter the time taken to sweep the whole band.

BRIEF DESCRIPTION OF THE DRAWINGS

FIG. 6 is a flow chart illustrating a data reproduction process to be executed by the channel selection apparatus.

EMBODIMENT OF THE INVENTION

A channel selection apparatus for receiving digital TV broadcast according to an embodiment of the invention will be described in detail with reference to the accompanying drawings.

Figure 1:
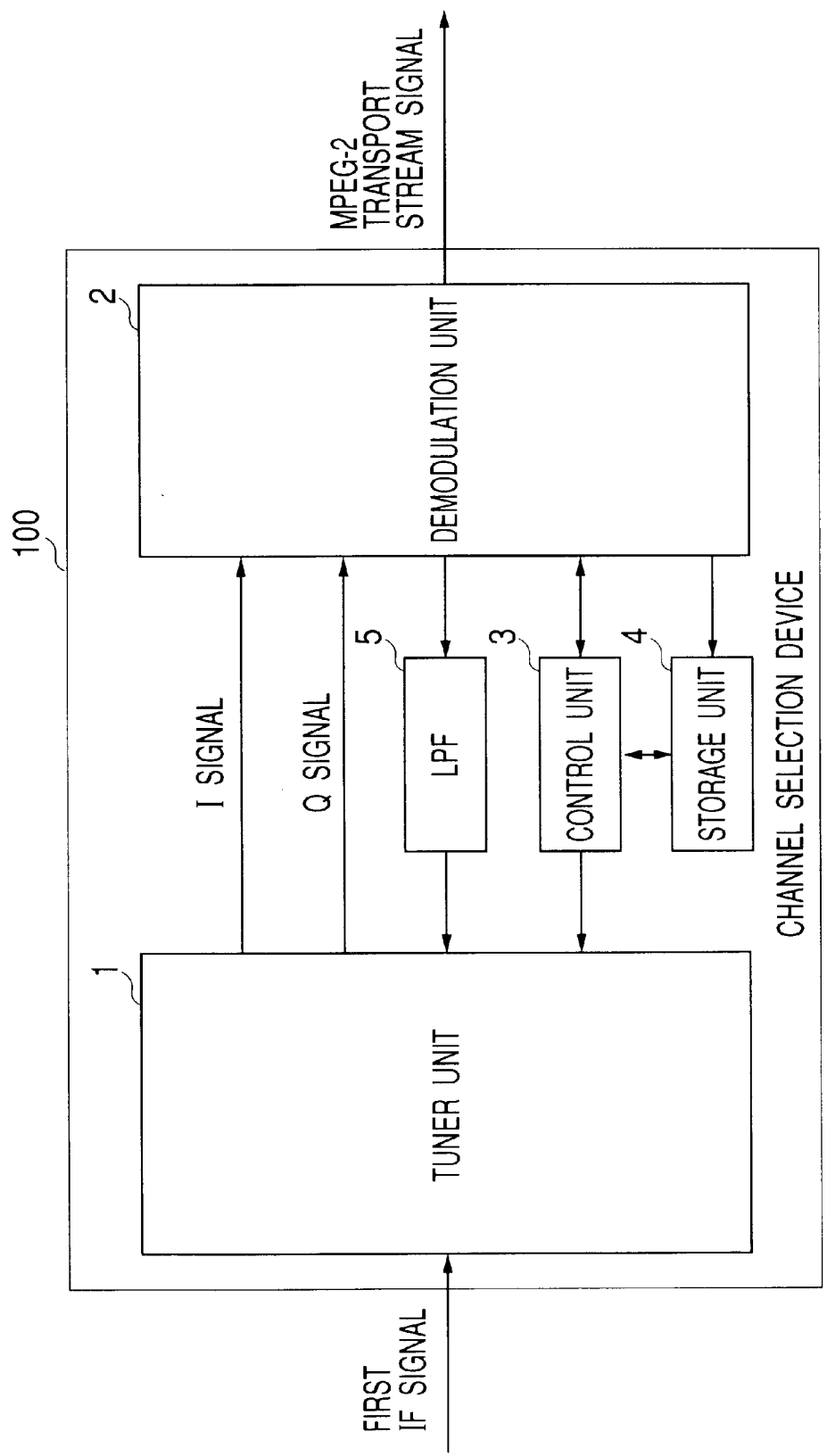
FIG. 1 is a diagram showing the structure of a channel selection apparatus for receiving digital TV broadcast according to an embodiment of the invention.

FIG. 1 is a diagram showing the structure of a channel selection apparatus for receiving digital TV broadcast (hereinafter called a channel selection apparatus).

As shown, this channel selection apparatus 100 is constituted of a tuner unit 1, a demodulation unit 2, a control unit 3, a storage unit 4 and an LPF 5.

The tuner unit 1 derives in-phase components (I signal) and quadrature components (Q signal) of a baseband signal from a first IF (Intermediate Frequency) signal received by a satellite antenna or the like and frequency-converted by an LAB (Low Noise Block down converter).

Figure 2:
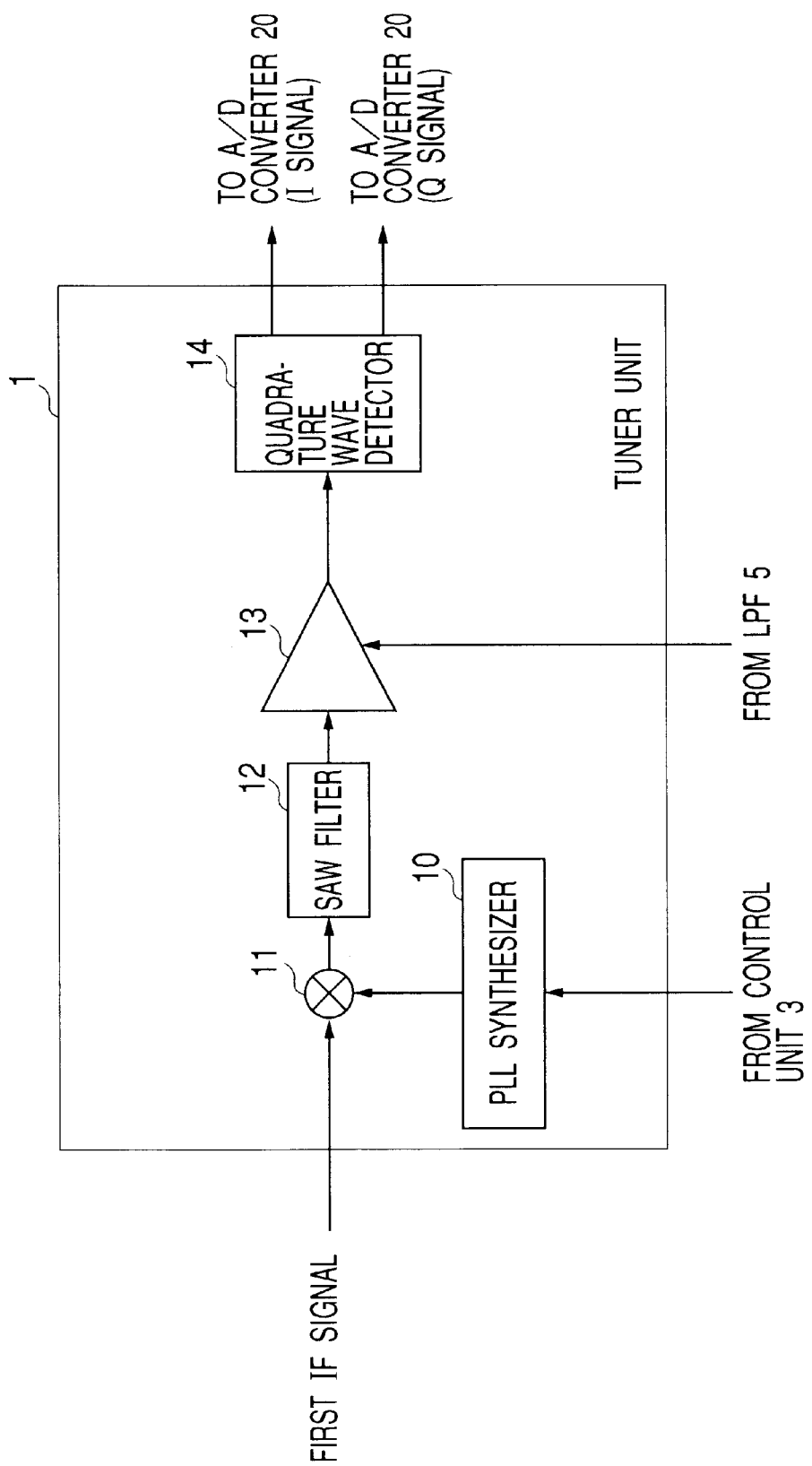
FIG. 2 is a diagram showing the structure of a tuner unit of the channel selection apparatus.

As shown in FIG. 2, the tuner unit 1 is constituted of a PLL synthesizer 10, a mixer 11, an SAW (Surface Acoustic Wave) filter 12, an AGC (Automatic Gain Control) amplifier 13 and a quadrature detector 14.

The PLL synthesizer 10 is constituted of a local oscillator, a variable frequency divider, a loop filter, a reference frequency oscillator, a phase frequency discriminator and the like. The PLL synthesizer 10 generates a local oscillation signal corresponding to PLL data supplied from the control unit 3.

The mixer 11 is a multiplier for multiplying a first IF signal externally supplied and a local oscillation signal output from the PLL synthesizer 10 to generate a second IF signal.

The SAW filter 12 is a surface acoustic wave filter for limiting the band of the second IF signal output from the mixer 11 to pass a predetermined frequency range of the second IF signal.

The AGC amplifier 13 is an amplifier made of an operational amplifier or the like. A gain of the AGC amplifier 13 is controlled by an AGC control voltage received from an AGC control circuit 25 of the demodulation unit 2 via LPF 5. The AGC amplifier 13 amplifies the second IF signal in such a manner that a power of a signal input to the quadrature detector 14 is maintained constant.

The quadrature detector 14 is constituted of a local oscillator, a π/2 phase shifter, a multiplier, an LPF and the like. The quadrature detector 14 is a detector circuit for deriving in-phase components (I signal) and quadrature components (Q signal) of a baseband signal from the second IF signal supplied from the AGC amplifier 13, through quasi synchronization detection.

The demodulation unit 2 shown in FIG. 1 receives a baseband signal from the tuner unit 1 and demodulates data to reproduce a MPEG2 (Moving Picture Expert Group Phase 2) transport signal (hereinafter called a TS signal). The TS signal contains service data for providing a user-selected service (such as a program of a TV channel).

Figure 3:
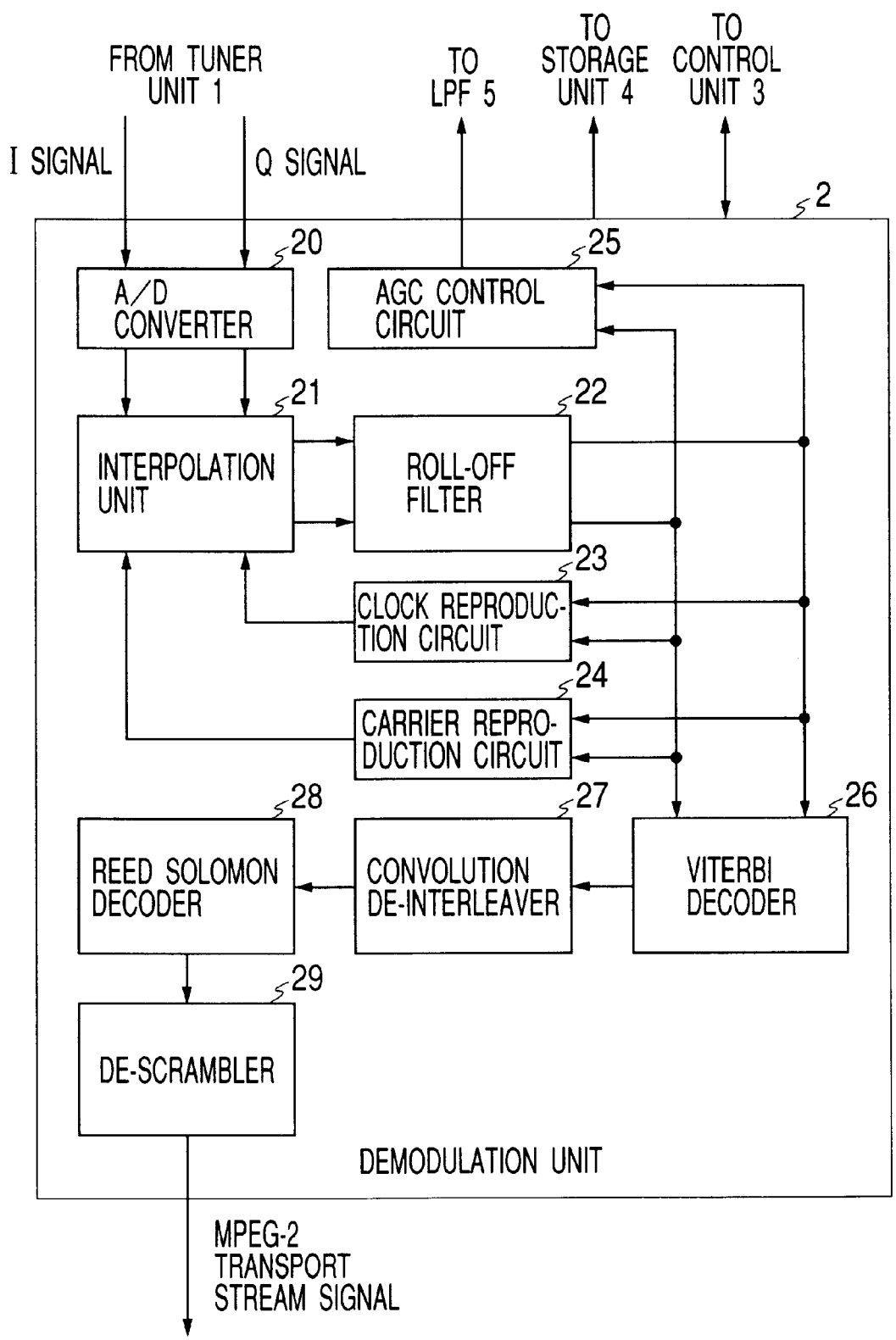
FIG. 3 is a diagram showing the structure of a reproduction unit of the channel selection apparatus.

As shown in FIG. 3, the demodulation unit 2 is constituted of an A/D (Analog/Digital) converter 20, an interpolation unit 21, a roll-off filter 22, a clock reproduction circuit 23, a carrier reproduction circuit 24, an AGC control circuit 25, a Viterbi decoder 26, a convolution de-interleaver 27, a Reed Solomon decoder 28 and a de-scrambler 29.

The A/D converter 20 converts the I and Q signals supplied from the tuner unit 1 into digital signals through sampling and quantization.

The interpolation unit 21 samples again the I and Q signals digitalized by the A/D converter 20 at a clock which is a multiple of a symbol rate, to convert data into substantial impulse trains in order to suppress the creation of code interference in the roll-off filter 22.

The roll-off filter 22 limits the pass band of data converted into substantial impulse trains supplied from the interpolation unit 21, so that a data waveform without code interference is created.

The clock reproduction circuit 23 is constituted of a band-pass filter circuit, a phase synchronization circuit and the like. The clock reproduction circuit 23 derives clock frequency components from data supplied from the roll-off filter 22 to generate a clock signal which defines a sampling point when the interpolation unit 21 samples again.

The clock reproduction circuit 23 includes a circuit for deciding whether the synchronization of a clock signal is locked or not. If it is decided that the synchronization was locked, the clock reproduction circuit 23 sets a clock lock flag F1 in the storage unit 4 to "1". If it is decided that the synchronization is not locked, the clock reproduction circuit 23 resets the clock lock flag F1 to "0".

The carrier reproduction circuit 24 is constituted of a phase synchronization circuit and the like. The carrier reproduction circuit 24 derives a reference signal from data supplied from the roll-off filter 22 and supplies it to the interpolation unit 21.

The carrier reproduction circuit 24 includes a circuit for deciding whether the synchronization of a carrier signal is locked or not. If it is decided that the synchronization was locked, the carrier reproduction circuit 24 sets a carrier lock flag F2 in the storage unit 4 to "1". If it is decided that the synchronization is not locked, the carrier reproduction circuit 24 resets the carrier lock flag F2 to "2".

The AGC control circuit 25 detects a signal level (e.g., voltage level) of data output from the roll-off filter 22, feeds back a voltage corresponding to the detected signal level to the AGC amplifier 13 of the tuner unit 1, so that the gain of the AGC amplifier 13 is controlled and a power of an output signal from the AGC amplifier 13 is made constant.

The AGC control circuit 25 supplies via LPF 5 an AGC control voltage for controlling the gain of the AGC amplifier 13, and the detected signal level of data is notified to the control unit 3.

The Viterbi decoder 26 Viterbi-decodes the data convolution-encoded on the transmission side in accordance with a Viterbi algorithm to correct any error of the data.

When decoding, the Viterbi decoder 26 detects an error rate to judge whether data can be correctly decoded. If it is decided that the data can be decoded correctly, the Viterbi decoder 26 sets a synchronization flag F3 in the storage unit 4 to "1". If it is decided that the data cannot be decoded correctly, the Viterbi decoder 26 resets the synchronization flag F3 to "0".

The convolution de-interleaver 27 recovers the original order of the data whose order was changed in the unit of byte on the transmission side.

The Reed Solomon decoder 28 decodes the data Reed-Solomon-encoded on the transmission side to correct any error of the data.

When decoding, the Reed Solomon decoder 28 detects an error rate to judge whether data can be correctly decoded. If it is decided that the data can be decoded correctly, the Reed Solomon decoder 28 sets a synchronization flag F4 in the storage unit 4 to "1". If it is decided that the data cannot be decoded correctly, the Reed Solomon decoder 28 resets the synchronization flag F4 to "0".

The de-scrambler 29 recovers original data from the data made random on the transmission side for energy spreading to thereby output a TS signal.

The de-scrambler 29 reads a header of a reproduced TS signal to judge whether a synchronization pattern (synchronization byte) can be detected. If it is decided that the synchronization pattern (synchronization byte) can be detected, the de-scrambler 29 sets a de-scramble synchronization flag F5 in the storage unit 4 to "1". If it is decided that the synchronization pattern (synchronization byte) cannot be detected, the de-scrambler 29 resets a de-scramble synchronization flag F5 in the storage unit 4 to "0".

The control unit 3 shown in FIG. 1 is made of an MPU (Micro Processing Unit) or the like, and controls the entirety of the channel selection apparatus for receiving digital TV broadcast.

The control unit 3 reads programs and data stored in the storage unit 4 to generate PLL data for setting the frequency of a local oscillation signal to be output from the PLL synthesizer 10.

In this case, upon reception of a notice of the signal level of data from the AGC control circuit 25 of the demodulation unit 2, the control unit 3 compares the signal level with a reference value stored in the storage unit 4. If the control unit 3 decides that the signal level of data is equal to or smaller than the reference value, the control unit 3 sends PLL data for changing the frequency of the local oscillation signal to the PLL synthesizer 10. On the other hand, if the control unit 3 decides that the signal level of data is larger than the reference value, the control unit 3 sets parameters necessary for signal processing at each circuit portion of the demodulation unit 2.

The demodulation unit 2 checks the flags F1 to F5 in the storage unit 4. If all the flags are "1", the demodulation unit 2 decides that it is possible to select a channel, and makes the PLL synthesizer 10 stop sweeping the predetermined frequency range.

The storage unit 4 is made of a semiconductor memory or the like and stores programs and data for defining the operation of the control unit 3.

The storage unit 4 stores the reference value to be compared with the voltage level of data detected by the AGC control circuit 25, the reference value being used when the control unit 3 generates PLL data.

Figure 4:
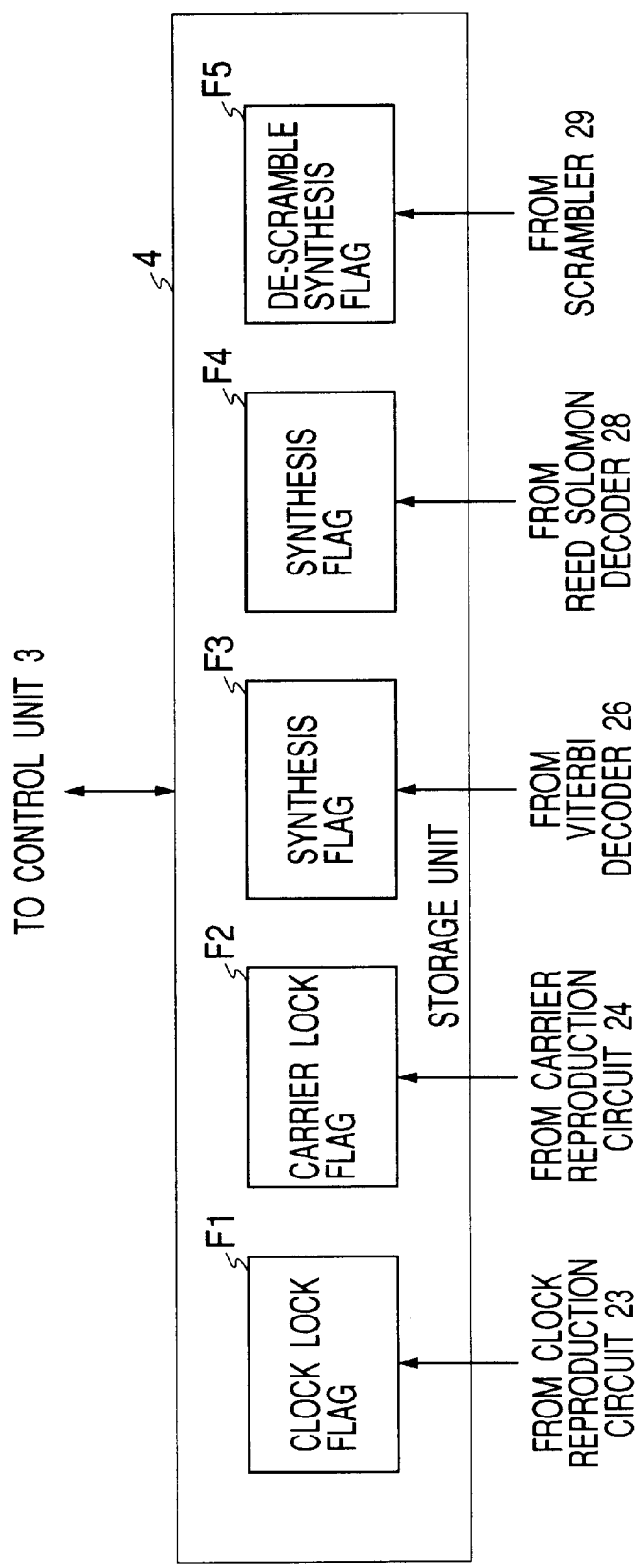
FIG. 4 is a diagram showing the structure of a storage unit of the channel selection apparatus.

As shown in FIG. 4, the storage unit 4 has also the flags F1 to F5 indicating a lock/synchronization state of signals at each circuit portion of the modulation unit 2.

The flag F1 is a clock lock flag indicating that the clock reproduction circuit 23 has established synchronization of the clock signal.

The flag F2 is a carrier lock flag indicating that the carrier reproduction circuit 24 has established synchronization of the carrier signal.

The flag F3 is a synchronization flag indicating that the Viterbi decoder 26 is correctly decoding data. The flag F4 is a synchronization flag indicating that the Reed Solomon decoder 28 is correctly decoding data.

The flag F5 is a de-scramble flag indicating that the de-scramble 29 has detected the synchronization pattern.

The clock reproduction circuit 23, carrier reproduction circuit 24, Viterbi decoder 26, Reed Solomon decoder 28 and de-scrambler 29 may notify the lock/synchronization state at each circuit portion directly to the control unit 3, without involving the flags F1 to F5 in the storage unit 4. Without checking all the flags F1 to F5, only the flag F5 may be checked to judge that the channel selection is possible in the corresponding frequency range.

LPF 5 shown in FIG. 1 is a low-pass filter circuit for removing harmonic components of the AGC control voltage output from the AGC control circuit 25 of the demodulation unit 2.

Next, the operation of the channel selection apparatus for receiving digital TV broadcast according to the embodiment of the invention will be described with reference to the accompanying drawings.

The channel selection apparatus 100 detects the signal level of demodulated data and compares it with the reference value. If the signal level is equal to or smaller than the reference value, a process of reproducing the TS signal is not executed but a channel selection (tuning) in a new frequency range is performed. Therefore, the channel selection apparatus can start providing services in a short time.

Figure 5:
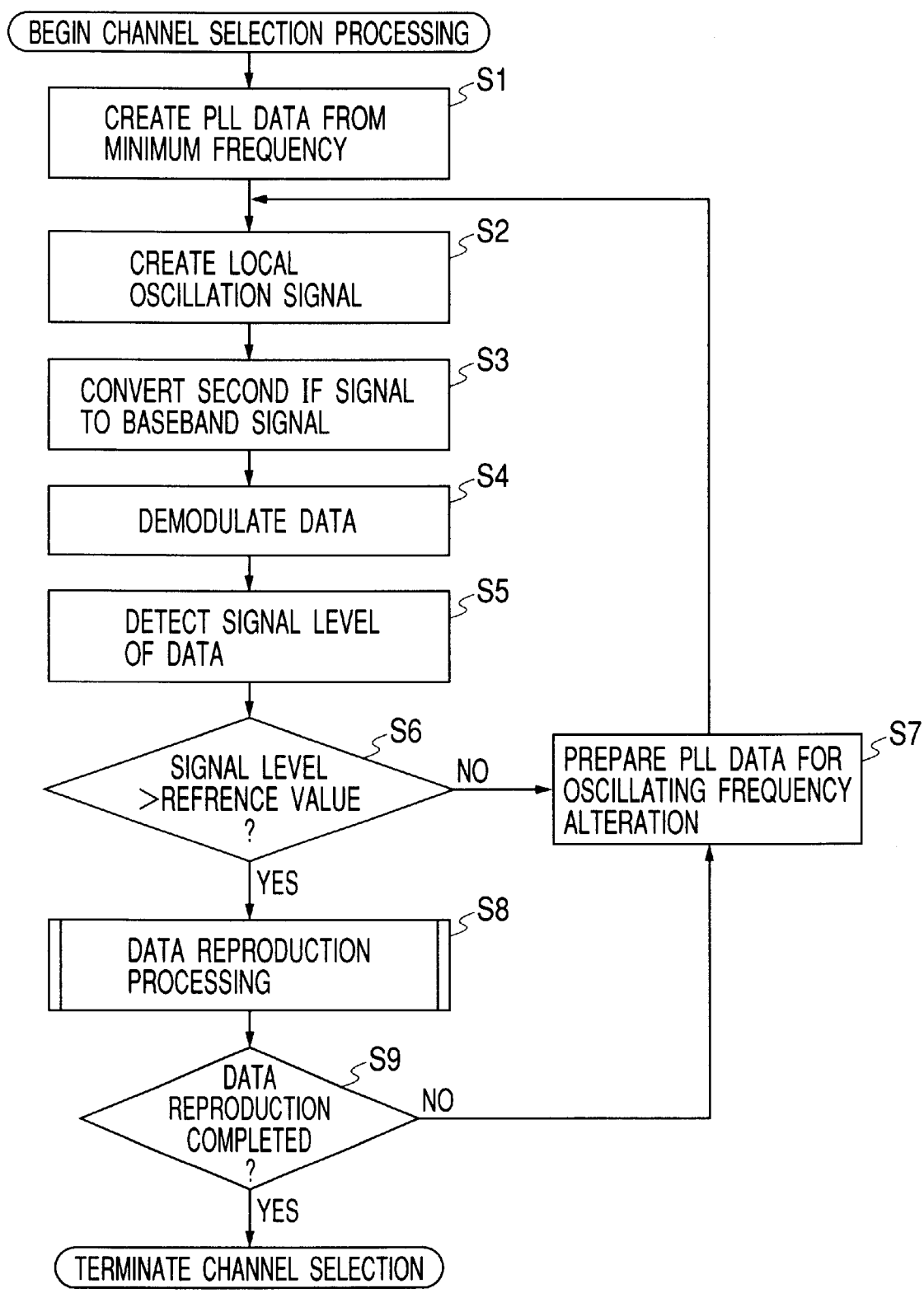
FIG. 5 is a flow chart illustrating a channel selection process to be executed by the channel selection apparatus.

FIGS. 5 and 6 are flow charts illustrating a channel selection process and a data reproduction process to be executed by the channel selection apparatus 100. The channel selection process shown in FIG. 5 is repetitively executed until the frequency reaches the end of the whole frequency range.

First, the control unit 3 generates PLL data for creating a local oscillation signal having a lowest (or highest) frequency in a predetermined frequency range, and sends the PLL data to the PLL synthesizer 10 (Step S1).

The PLL synthesizer 10 generates a local oscillation signal having an oscillation frequency corresponding to the PLL data supplied from the control unit 3, and sends the local oscillation signal to the mixer 11 (Step S2).

The mixer 11 multiplies the first IF signal externally supplied and the local oscillation signal supplied from the PLL synthesizer 10 to generate a frequency-converted second IF signal which is sent to the quadrature detector 14 via the SAW filter 12 and AGC amplifier 13.

The quadrature detector 14 performs quasi synchronization detection of the second IF signal to convert it into in-phase components (I signal) and quadrature components (Q signal) of a baseband signal which are supplied to the A/D converter 20 of the demodulation unit 2 (Step S3).

The baseband signal is digitalized by the A/D converter 20 and thereafter, subjected to waveform shaping, phase adjustment and the like at the interpolation unit 21, roll-off filter 22, clock reproduction circuit 23 and carrier reproduction circuit 24.

In the above manner, data is demodulated from a QPSK (Quadrature Phase Shift Keying) modulated signal. The demodulated data is supplied to the AGC control circuit 25 and Viterbi decoder 26.

The AGC control circuit 25 detects the signal level of data to generate an AGC control voltage, supplies the AGC control voltage to the AGC amplifier 13 via LPF 5, and notifies the detected signal level of data to the control unit 3 (Step S4).

Upon reception of a notice of the signal level of data from the AGC control circuit 25, the control unit 3 compares it with the reference value stored in the storage unit 4 to judge whether the signal level of data is larger than the reference value (Step S5).

If the control unit 3 decides that the signal level of data is equal to or smaller than the reference value (NO at Step S6), then the control unit 3 sends PLL data to the PLL synthesizer 10, the PLL data notifying that the oscillation frequency of a local oscillation signal should be changed (Step S7).

The frequency of the local oscillation signal to be changed by the control unit 3 changes a predetermined frequency range capable of AFC (Automatic Frequency Control) which is decided in accordance with the characteristics of a local oscillator in the quadrature detector 14, a data reproduction performance of the demodulation unit 2, and the like. Namely, for example, if sweeping is possible in a predetermined frequency range of ±5 MHz around a reference frequency, the frequency of the local oscillation signal is incremented or decremented sequentially by 10 MHz.

Thereafter, the flow returns to Step S2 whereat the PLL synthesizer 10 changes a frequency division rate of a variable frequency divider or performs other operations to change the frequency of the local oscillation signal, to output the local oscillation signal, and to repeat Steps S2 to S6.

In the above manner, if it is apparent that desired data is not contained in a predetermined frequency range, the next predetermined frequency range can be used immediately. It is therefore possible to shorten the time taken to judge whether a channel selection is possible in the frequency range.

If the control unit 3 decides that the signal level of data indicated by the notice supplied from the AGC control circuit 25 is larger than the reference value (YES at Step S6), then the control unit 3 starts the data reproduction process of reproducing service data for providing a service from the data demodulated at Step S4 (Step S8). Namely, the control unit 3 controls the operation of each circuit portion of the demodulation unit 2 to reproduce the service data. The details of the data reproduction process will be later given.

The control unit 3 decides whether the service data can be reproduced from the data demodulated at Step S4, i.e., whether the channel selection has been completed (Step S9).

If the control unit 3 decides that the channel selection is not completed (NO at Step S9), then the flow returns to Step S7 whereat the control unit 3 sends the PLL data to the PLL synthesizer 10, the PLL data notifying that the oscillation frequency of a local oscillation signal should be changed.

If the control unit 3 decides that the channel selection has been completed (YES at Step S9), the channel selection process is terminated, for example, by limiting a change in the frequency of the local oscillation signal of the PLL synthesizer 10, only to phase synchronization.

After one channel selection is completed, this receivable frequency is stored in a memory (not shown) and starts a channel selection of a next receivable channel or station, similar to conventional techniques. The channel selection is performed for the whole frequency range so that frequencies corresponding to receivable stations are eventually stored in the memory to complete station presetting.

The data reproduction process at Step S8 shown in FIG. 5 will be described with reference to the flow chart shown in FIG. 6.

First, the control unit 3 notifies parameters necessary for each process of reproducing service data to each proper circuit portion of the reproduction unit 2, for example, by notifying a data encoding factor to the Viterbi decoder 26 (Step S10).

The Viterbi decoder 26 performs Viterbi-decoding of the data supplied from the roll-off filter 22, and sends the decoded data to the convolution de-interleaver 27 (Step S11).

In this case, if the Viterbi decoder 26 detects from a measured decoding error rate that decoding is being performed correctly, then the synchronization flag F3 in the storage unit 4 is set to "1". When the Viterbi decoder 26 becomes impossible to perform correct decoding, the synchronization flag F3 is reset to "0".

The convolution de-interleaver 27 rearranges the order of data supplied from the Viterbi decoder 26 because the order of the data was changed before transmission. The convolution de-interleaver 27 sends the data with the rearranged order to the Reed Solomon decoder 28 (Step S12).

The Reed Solomon decoder 28 decodes the data supplied from the convolution de-interleaver 27 and sends it to the de-scrambler 29 (Step S13).

In this case, if the Reed Solomon decoder 28 detects from a measured decoding error rate that decoding is being performed correctly, then the synchronization flag F4 in the storage unit 4 is set to "1". When the Reed Solomon decoder 28 becomes impossible to perform correct decoding, the synchronization flag F4 is reset to "0".

The de-scrambler 29 recovers the original data from the data supplied from the Reed Solomon decoder 28 to output the TS signal because the data was made random for energy spreading (Step S14).

In this case, if the de-scrambler 29 detects the synchronization pattern (synchronization byte) by reading the header of the TS signal, the de-scramble synchronization flag F5 in the storage unit 4 is set to "1". If the de-scrambler 29 cannot detect the synchronization pattern, the de-scrambler synchronization flag F5 is reset to "0".

The control unit 3 reads the flags F1 to F5 in the storage unit 4 (Step S15) to judge whether all the read flags are "1" (Step S16).

If the control unit 3 decides that all the flags are "1" (YES at Step S16), it is decided that the channel selection has been completed, so that the data reproduction process is terminated and the flow returns to Step S9 shown in FIG. 5 (Step S17).

If the control unit 3 detects some flag having "0" (NO at Step S16), it is decided that the channel selection is not completed, so that the data reproduction process is terminated and the flow returns to Step S9 shown in FIG. 5 (Step S18).

In the above manner, the channel selection apparatus 100 reproduces service data from the demodulated data to perform a channel selection, if the signal level detected by the AGC control circuit 25 is larger than the reference value.

As described so far, in the channel selection apparatus 100, the control unit 3 compares the voltage level of data detected by the AGC control circuit 25 with the reference value, and when it is decided that the voltage level is equal to or smaller than the reference value, the next frequency range (band) is swept.

It is therefore possible to quickly sweep the band used by digital TV broadcast and select a channel in a short time.

In the above embodiment, the reference value used by the control unit 3 for the comparison with the signal level of data notified from the AGC control circuit 25 is stored in the storage unit 4. The invention is not limited only to storing the reference value in the storage unit 4.

An optional method commonly used in the state of the art may be used. For example, a constant voltage generator circuit is provided to generate a reference voltage which is compared with the voltage level of data supplied from the AGC control circuit 25. The invention is not limited only to the channel selection apparatus for receiving digital TV broadcast and selecting a station, but is applicable to various communication apparatus having the same structure as that of the invention. For example, the invention is applicable to a receiver for receiving digital audio signals via a communication satellite, a receiver for receiving computer software, data capable of being processed by computers and the like, or other apparatus.

INDUSTRIAL APPLICABILITY

As described above, according to the invention, the signal level of demodulated data is detected and compared with the reference value. If the signal level is equal to or smaller than the reference value, the next frequency range is swept to select a channel without reproducing service data. It is therefore possible to shorten the time taken to select a channel.

What is claimed is:

1. A channel selection apparatus for digital TV broadcast use for receiving a first intermediate frequency (IF) signal and for automatically sweeping a predetermined frequency range for tuning, said apparatus comprising channel selection means, and reproduction means, wherein said channel selection means:

oscillation signal creation means for creating a local oscillation signal to be used for changing the frequency of the first IF signal;

frequency conversion means for converting the first IF signal into a second IF signal by using the local oscillation signal created by said oscillation signal creation means;

data demodulation means for demodulating data from the second IF signal;

signal level detection means for detecting a signal level of the data demodulated by said data demodulation means; and operation switching means for deciding whether the signal level detected by said signal level detection means is larger than a reference value, said operation switching means being operable to change the frequency of the local oscillation signal by an amount corresponding to said predetermined frequency range without subsequently operating said reproduction means so as operation in a new frequency range, if it is decided that the signal level detected by said signal level detection means is equal to or smaller than the reference value, and said reproduction means comprises:

data reproduction means for reproducing service data for providing a service from the data demodulated by said data demodulation means.

2. The channel selection apparatus for digital TV broadcast use according to claim 1, wherein after it is decided that the signal level detected by said signal level detection means is equal to or smaller than the reference value and the frequency of the local oscillation signal is changed, processes to be executed by said oscillation signal creation means, frequency conversion means, demodulation means, signal level detection means and operation switching means, respectively of said channel selection means, are executed.

3. The channel selection apparatus for digital TV broadcast use according to claim 2, further comprising channel registration means, said channel registration means comprises:

reproduction detection means for deciding whether the service data can be reproduced by said data reproduction means; and frequency registration means for registering at least the frequency of the local oscillation signal if it is decided that the signal level detected by said signal level detection means is larger than the reference value and if said reproduction detection means decides that the service data can be reproduced.

4. The channel selection apparatus for digital TV broadcast use according to claim 3, wherein after the oscillation frequency is registered, the frequency of the local oscillation signal is change to another frequency, and processes to be executed by said channel selection means, reproduction means and channel registration means are again executed.

5. The channel selection apparatus for digital TV broadcast use according to claim 1 or 4, wherein the frequency of the local oscillation signal is changed by increasing or decreasing the frequency by a predetermined amount.

6. The channel selection apparatus for digital TV broadcast use according to claim 5, wherein the predetermined amount is determined by the predetermined frequency range to be swept.

7. The channel selection apparatus for digital TV broadcast use according to claim 5, wherein the frequency of the local oscillation signal is changed over a whole band of the digital TV broadcast.

8. The channel selection apparatus for digital TV broadcast use according to claim 3, wherein if it is decided that the signal level detected by said signal level detection means is larger than the reference value, said data reproduction means reproduces the service data.

9. The channel selection apparatus for digital TV broadcast use according to any one of claims 1–4 and 8, wherein said data reproduction means comprises signal amplifier means for amplifying the second IF signal; and wherein said signal level detection means comprises means for feeding back a voltage to said signal amplifier means, the voltage defining a gain of said signal amplifier means to make constant a power of an input signal to said data modulation means.

10. A channel selection method for digital TV broadcast use, for receiving a first intermediate frequency (IF) signal and automatically sweeping a predetermined frequency range for tuning said method comprising a channel selection step and a reproduction step, wherein:

said channel selection step comprises:

an oscillation signal creation step of creating a local oscillation signal to be used for changing the frequency of the first IF signal;

a frequency conversion step of converting the first IF signal into a second IF signal by using the local oscillation signal created by said oscillation signal creation step;

a data demodulation step of demodulating data from the second IF signal;

a signal level detection step of detecting a signal level of the data demodulated by said data demodulation step; and operation switching step of deciding whether the signal level detected in said signal level detection step is larger than a reference value, said operation switching step serving to change the frequency of the local oscillation signal by an amount corresponding to said predetermined frequency range without moving to the subsequent reproduction step and then return to said frequency conversion step, if it is decided that the signal level detected in said signal level detection step is equal to or smaller than the reference value, and said reproduction step comprises:

a data reproduction step of reproducing service data for providing a service from the data demodulated in said data demodulation step, if it is decided that said signal level is larger than the reference valve.

\* \* \* \* \*